United States Patent
Mege et al.

(10) Patent No.: US 7,974,592 B2
(45) Date of Patent: Jul. 5, 2011

(54) LINEARIZATION IN A TRANSMISSION CHAIN

(75) Inventors: Philippe Mege, Bourg la Reine (FR); Pierre-Yves Le Gal, Loperhet (FR); Christophe Brutel, Cagnes (FR)

(73) Assignee: Eads Secure Networks, Elancourt (FR)

( * ) Notice: Subject to any disclaimer, the term of this patent is extended or adjusted under 35 U.S.C. 154(b) by 657 days.

(21) Appl. No.: 12/150,251

(22) Filed: Apr. 25, 2008

(65) Prior Publication Data

US 2008/0268794 A1   Oct. 30, 2008

(30) Foreign Application Priority Data

Apr. 25, 2007 (FR) .................................. 07 03004

(51) Int. Cl.
*H04B 1/04* (2006.01)
(52) U.S. Cl. ..................................... 455/114.3; 375/295
(58) Field of Classification Search .................. 455/91, 455/114.1, 114.2, 114.3, 115.1, 126, 127.1; 375/296, 297; 330/149, 49, 51
See application file for complete search history.

(56) References Cited

U.S. PATENT DOCUMENTS

| | | | | |
|---|---|---|---|---|
| 6,075,411 A * | 6/2000 | Briffa et al. | ............ | 330/149 |
| 7,336,725 B2 * | 2/2008 | Cova | ............ | 375/296 |
| 2009/0121788 A1 * | 5/2009 | Deisch | ............ | 455/114.3 |
| 2010/0105342 A1 * | 4/2010 | Pei | ............ | 455/114.3 |

FOREIGN PATENT DOCUMENTS

WO   WO 99/33170   7/1999

OTHER PUBLICATIONS

"Compensation of Nonlinear Distortion During Transmission Based on the Adaptive Predistortion Method", Matsuoka et al., IEICE Trans. Electron. vol. E80-C, No. 6, Jun. 1997, pp. 782-787.
French Preliminary Search Report dated Oct. 29, 2007, Appl. No. FR 0703004.

* cited by examiner

*Primary Examiner* — Thanh C Le
(74) *Attorney, Agent, or Firm* — McCracken & Frank LLP

(57) ABSTRACT

A transmission chain comprises a power amplifier adapted for receiving as input a signal to be amplified $S_w(t)$ and for providing as output an amplified signal $D_w(t)$; a predistortion module comprising a linearization unit adapted for applying a predistortion coefficient $W(t)$ to an input signal $S(t)$, and a unit for determining said predistortion coefficient. The input signal $S(t)$ is received and the amplified signal $D_w(t)$ is received through a return pathway, at the level of the unit for determining the predistortion coefficient, and the predistortion coefficient is determined on the basis of a comparison between the input signal and the amplified signal. Next, at the level of the linearization unit, the predistortion coefficient is applied to the input signal to provide as output the signal to be amplified. The determining unit determines the predistortion coefficient on the basis of a first-order approximation of the input signal.

22 Claims, 2 Drawing Sheets

LINEARIZATION IN A TRANSMISSION CHAIN

FIELD OF INVENTION

The present invention pertains to a transmission chain for radio transmission comprising a power amplifier which introduces distortion into the signal to be processed by this transmission chain.

BACKGROUND OF THE INVENTION

Radio transmission systems which comprise a transmission chain having a power amplifier exhibit distortion in regard to the linearity of the signal in the operating span of the power amplifier. Moreover, in order to increase the efficiency of the power amplifier, provision is conventionally made to use it in a zone of its operating span which is close to a saturation zone. Now, this distortion is all the more significant in such an operating zone.

Such distortion degrades the frequency spectrum of the signal transmitted and therefore may disturb transmission in adjacent channels ('ACPR', standing for 'Adjacent Channel Power Ratio').

To avoid this distortion, provision may be made to distance the operating point from the saturation zone of the power amplifier. However, in this case, the efficiency of the latter is thereby diminished. Therefore, the consumption of the transmission chain increases and its energy self-sufficiency is thereby restricted.

Provision may also be made to use a linearization procedure consisting in applying a predistortion of the modulated signal before providing it to the power amplifier, the predistortion then making it possible to obtain at the output of the power amplifier the signal that one wishes to transmit corrected for the effects of distortion, in particular distortions of the output amplitude as a function of the amplitude of the input signal and distortions of the phase of the output signal as a function of the amplitude of the input signal.

Such linearization procedures are based on determining a plurality of parameters that are intended to make it possible to determine the predistortion which should be applied to the signal to be provided to the power amplifier. Such a determination is as a general rule complex. Additionally, conventionally, these linearization procedures are based on an initialization or calibration phase in the course of which initial predistortion coefficients are determined. Next, through feedback action, the predistortion coefficients are determined in a tailored manner so as to adjust their respective values as a function of modifications which may occur over time.

Thus, these procedures have the drawback of managing predistortion coefficients which are complex to determine, their determination requiring a prior calibration phase.

SUMMARY OF THE INVENTION

The present invention aims to improve the situation.

A first aspect of the present invention proposes a method of processing a signal in a transmission chain comprising:
  a power amplifier adapted for receiving as input a signal to be amplified and for providing as output an amplified signal;
  a predistortion module comprising, on the one hand, a linearization unit adapted for applying a predistortion coefficient to an input signal, and, on the other hand, a unit for determining said predistortion coefficient; said processing method comprising the following steps at the level of the predistortion module:
  /a/ at the level of the unit for determining the predistortion coefficient, receiving, on the one hand, the input signal and, on the other hand, the amplified signal through a return pathway, and determining the predistortion coefficient on the basis of a comparison between the input signal and the amplified signal observed through the return pathway;
  /b/ at the level of the linearization unit, applying the predistortion coefficient to the input signal, so as to provide as output the signal to be amplified;
in which the predistortion coefficient is determined, at the level of the determining unit, on the basis of a first-order approximation of the input signal.

By proceeding thus, it is then possible to determine simply but reliably a predistortion coefficient so as to reduce, or even cancel the distortion which may be generated at the level of the power amplifier. The present invention is more particularly applicable to signals to be transmitted which possess an amplitude modulation component but for which the amplitude variation remains limited. On account of the limitation of this amplitude variation, the first-order approximation presented hereinbelow may be applied.

In an embodiment of the present invention, the input signal satisfies the following equation according to the first-order approximation:

$$S(t)=A\cdot(1+a(t))\cdot e^{j\cdot\phi(t)},$$

where A represents the mean amplitude of the signal, $a(t)$ represents the relative variation of the amplitude of the signal, j represents the square root of $-1$; and $\phi(t)$ the phase of the signal; and in which the predistortion coefficient $W(t)$ satisfies the following equation:

$$W(t)=C(t)+E(t)\cdot a(t)$$

where $C(t)$ and $E(t)$ respectively correspond to first and second predistortion parameters which are complex functions of time.

In a particular embodiment of the present invention, one of the predistortion parameters, the parameter $C(t)$, may advantageously be fixed at the value 1.

The power of the output signal may be affected by the fact that this output signal is introduced into the return pathway by coupling. By thus fixing the value of the parameter $C(t)$ at 1, it is then possible to circumvent this problem. Moreover, in this embodiment, only the predistortion parameter $E(t)$ remains to be determined, this helping to simplify the implementation of such a method.

Provision may advantageously be made to determine at least one out of the first and second predistortion parameters by applying a stochastic gradient algorithm.

The predistortion parameter $E(t)$ may satisfy the following equation:

$$E(t+1) = E(t) + \mu_e \cdot e(t+1) \cdot \left(\frac{D_w(t+1)}{W(t)}\right)^* \cdot a(t+1)$$

where $D_W(t+1)$ corresponds to the signal amplified by the power amplifier;
  where $e(t+1)=S(t+1)-D_W(t+1)$;
  where $\mu_e$ is the step size of the gradient for the predistortion parameter $E(t)$; and
the predistortion coefficient satisfies the following equation:

$$W(t+1)=C(t)+E(t)\cdot a(t+1)$$

Furthermore, if it is not forced to the value 1, the predistortion parameter C(t) can satisfy the following equation:

$$C(t+1) = C(t) + \mu_c \cdot e(t+1) \cdot \left(\frac{D_w(t+1)}{W(t)}\right)^*$$

where $D_W(t+1)$ corresponds to the amplified signal output by the power amplifier;
where $\mu_c$ is the step size of the gradient for the predistortion parameter C(t); and
where W(t) corresponds to the predistortion coefficient.

In an embodiment of the present invention, the signal to be amplified is organized in the form of frames and the predistortion coefficient is updated every N frame(s), N being an integer greater than or equal to 1.

Thus, the implementation of such a method can be simplified with respect to an embodiment in the course of which the determination of the predistortion coefficient is performed in a continuous manner.

Provision may also be made for the implementation of such a method to be preceded by an initialization phase is the course of which at least one initial predistortion coefficient is determined. In this case, previously established measurements may be used as the basis for determining this initial predistortion coefficient, these measurements being carried out independently of the adaptive processing applied then to the signal to be transmitted.

In the case where it is considered that the input signal S(t) (14) and the amplified signal $D_W(t)$ (16) being shifted by a delay τ, the predistortion parameter E(t) satisfies the following equation:

$$E(t+1) = E(t) + \mu_e \cdot e(t+1) \cdot \left(\frac{D_w(t+1)}{W(t)}\right)^* \cdot a(t+1)$$

where $D_W(t+1)$ corresponds to the signal amplified by the power amplifier and received at the level of the determining unit via the return pathway;
where $e(t+1) = S(t+1-\tau) - D_W(t+1)$;
where $\mu_e$ is the step size of the gradient for the predistortion parameter E(t); and
the predistortion coefficient satisfies the following equation:

$$W(t+1) = C(t) + E(t) \cdot a(t+1)$$

Provision may also be made for the input signal S(t) to be decomposed into a plurality of portions of input signal, each portion of input signal belonging to various amplitude spans. A plurality of predistortion coefficients $W_i(t)$ can then be obtained, for i going from 1 to N, N being an integer strictly greater than 1, respectively for the plurality of portions of input signal, by applying steps /a/ and /b/ to each of said portions of input signal, on the basis of a first-order approximation of said portion of input signal.

By virtue of these arrangements, the application of such a method to an input signal exhibiting larger amplitude variations may be advantageous.

A second aspect of the present invention proposes a signal transmission chain comprising:
a power amplifier adapted for receiving as input a signal to be amplified and for providing as output an amplified signal;
a predistortion module comprising, on the one hand, a linearization unit adapted for applying a predistortion coefficient to an input signal, and, on the other hand, a unit for determining said predistortion coefficient;
in which the unit for determining the predistortion coefficient is adapted for receiving, on the one hand, the input signal and, on the other hand, the amplified signal, and for determining the predistortion coefficient on the basis of a comparison between the input signal and the amplified signal on the basis of a first-order approximation of the input signal; and,
in which the linearization unit is adapted for receiving the input signal, and applying the predistortion coefficient so as to provide as output the signal to be amplified.

This transmission chain may also comprise means adapted for implementing a method for processing a signal according to the first aspect of the present invention.

Other aspects, aims and advantages of the invention will become apparent on reading the description of one of its embodiments.

BRIEF DESCRIPTION OF THE DRAWINGS

The invention will also be better understood with the aid of the drawings, in which.

DETAILED DESCRIPTION OF THE PREFERRED EMBODIMENTS

Figure 1:
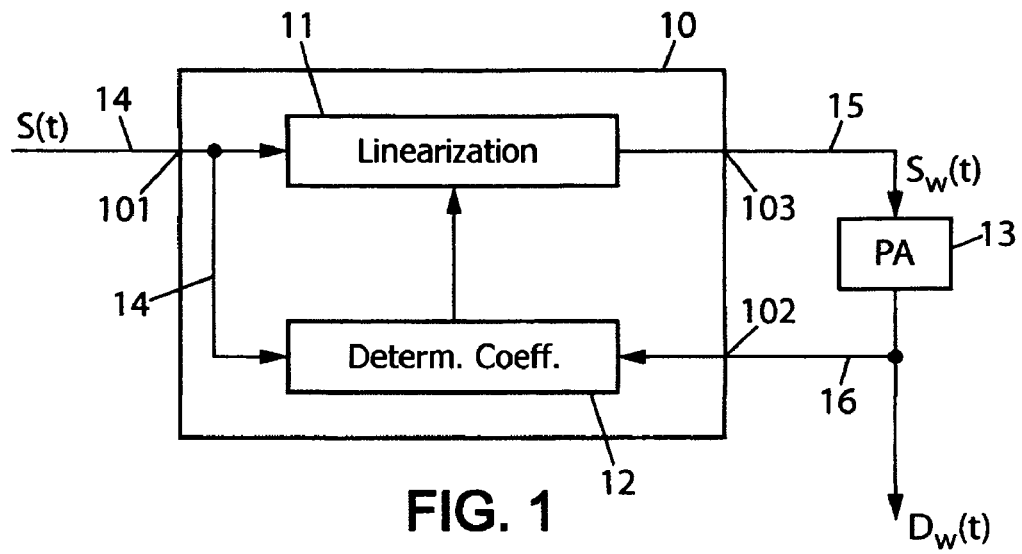
FIG. 1 illustrates a part of a radio signal transmission chain according to an embodiment of the present invention.

FIG. 1 illustrates a part of a radio signal transmission chain in an embodiment of the present invention.

This part of the transmission chain comprises a predistortion module 10 and a power amplifier 13. The predistortion module 10 exhibits a first input 101 adapted for receiving an input signal 14 and an output 103 for providing the power amplifier 13 with a signal to be amplified 15. Thus, the predistortion module 10 is in charge of transforming an input signal 14 into an output signal which is the signal to be amplified 15.

This predistortion module 10 furthermore comprises a return link 16 through which the amplified signal is injected as feedback via an input 102 of the module 10.

It furthermore comprises a linearization unit 11 which is in charge of applying one or more predistortion coefficients to the input signal 14 so as to obtain a signal to be amplified, the application of the predistortion coefficient being intended to counterbalance the distortion which ensues from the signal amplification implemented by the power amplifier, so that this distortion is thereby reduced, or even cancelled out.

It also comprises a unit 12 for determining a predistortion coefficient, which is adapted for receiving, on the one hand, the input signal 14 and, on the other hand, the amplified signal 16 provided by the power amplifier 13 and which is injected as feedback into the predistortion module 10. Next, on the basis of a comparison of these two signals received, the determining unit 12 is in charge of determining the predistortion coefficient or coefficients to be applied to the input signal at the level of the linearization unit 11. It is then able to provide the predistortion coefficient to the linearization unit 11 which can then apply it to the input signal.

The following notation is used hereinbelow:

S(t) the input signal 14 that one wishes to transmit via a radio transmission as output from the transmission chain and which is provided as output of a modulator to the predistortion module 10 according to an embodiment of the present invention;

$S_W(t)$ the output signal 15 from the predistortion module, that is to say the input signal for the power amplifier;

$D_W(t)$ the output signal from the power amplifier which corresponds also to the feedback signal 16 entering the predistortion module; and W(t) the predistortion to be applied to the signal at the level of the predistortion module 10.

Hereinbelow, if X is a complex number, Re(X) denotes the real part of this complex number and Im(X) denotes the imaginary part of this complex number. X* is the conjugate of the complex number X.

Furthermore, for X a complex variable, and f(X) a function of this complex variable, one writes:

$$\frac{df(X)}{dX_{complex}} = \frac{df(X)}{d\text{Re}(X)_{real}} + j \cdot \frac{df(X)}{d\text{Im}(X)_{real}}$$

where "complex" and "real" indicated as subscripts to the derivatives specify respectively derivatives in the sense of differentiation with respect to a complex variable and with respect to a real variable.

It follows that:

if Y is a real variable and g(Y) is a function of this real variable, the following equation may be written:

$$\frac{dg(Y)}{dY_{real}} = 1/2 \cdot \frac{dg(Y)}{dY_{complex}} + \frac{dg(Y)}{dY^*_{complex}}$$

Moreover, if g(Y) is a real-value function, the following equation is satisfied:

$$\frac{dg(Y)}{dY_{real}} = \text{Re}\frac{dg(Y)}{dY_{complex}}$$

Furthermore, if X is a complex number:

$$\frac{dX}{dX_{complex}} = 0$$

and $$\frac{dX}{dX^*_{complex}} = 2$$

Additionally if f(X) is a function of the complex variable X, we may write:

$$\frac{d(\|f(X)\|^2)}{dX_{complex}} = 2 \cdot f(X) \cdot \frac{df^*(X)}{dX_{complex}}$$

We also have, if X is a complex variable and if f(X) and g(X) are functions of this complex variable, a rule for changing variable which satisfies the following equation:

$$\frac{dg(X)}{d(X)_{complex}} = 1/2 \cdot \frac{dg(X)}{df(X)_{complex}} + \frac{df^*(X)}{dX_{complex}}$$

The other rules applicable to differentiation with respect to a complex variable follow from those of conventional differentiation with respect to a real variable.

Hereinbelow, by default in the case where then subscripts "complex" and "real" are not used, differentiation with respect to a real number corresponds to differentiation in the real sense, and, differentiation with respect to a complex number corresponds to differentiation in the complex sense.

A method of signal processing according to an embodiment of the present invention is particularly suitable for a modulation comprising an amplitude modulation component whose amplitude variations are relatively limited.

This processing method makes it possible to simplify the determination of the predistortion to be applied by processing the input signal in the form of a first-order approximation. It is thus possible to obtain a reliable, accurate and adaptive processing method without having to resort to a prior calibration phase, as in the prior art, while implementing procedures for simple determination of the predistortion. Thus, the following first-order approximation may be made:

$A(t) = \|S(t)\| = A \cdot (1 + a(t))$, with a(t) small compared with 1 and A a constant.

According to this aspect, the predistortion W(t) to be applied to the signal before its amplification by the power amplifier may be expressed in the following form:

$W(t) = C(t) + E(t) \cdot a(t)$ where C(t) and E(t) are predistortion parameters of the predistortion coefficient.

These parameters may vary only slowly over time with t so as to follow the medium and/or long term variations of the power amplifier. Indeed, the real-time behavior of the predistortion module may be adapted by adapting the updating frequency of the predistortion parameters.

Such an approximation may be justified on the basis of the fact that it is assumed that the power amplifier itself causes the distortions in the signal to be transmitted, or at the very least causes the most significant distortions.

The signal S(t) output by the modulator may be expressed in the form:

$S(t) = A \cdot (1 + a(t)) \cdot e^{j \cdot \phi(t)}$, with j representing the square root of −1; and φ(t) the phase of the signal.

The output from the power amplifier may then be written in the form:

$D_W(t) = B \cdot (1 + a_1 \cdot a(t)) \cdot e^{j[\phi(t) + k \cdot a(t) + \phi_0]}$ where $a_1$ represents the AM/AM distortion, that is to say the distortion of the output amplitude of the power amplifier due to the variation in the amplitude of the input signal, where k represents the AM/PM distortion of the power amplifier, that is to say the distortion of the output phase of the power amplifier due to the variation in the amplitude of the input signal;

where B is a constant; and where $\phi_0$ is a constant.

The AM/AM and AM/PM distortions are the principal components of the distortions generated by the power amplifiers.

Hereinbelow, $W_{opt}(t)$ denotes the optimal predistortion coefficient, that is to say the predistortion coefficient which makes it possible to compensate optimally for the distortion introduced by the power amplifier. This optimal predistortion coefficient satisfies the following equation:

$$W_{opt}(t) = A_W(t) \cdot e^{j \phi_W(t)}$$

where $A_W$ is an amplitude and $\phi_W$ is a phase.

The signal $S_{W_{opt}}$ obtained after applying the optimal predistortion coefficient to the signal S(t) entering the predistortion module then satisfies the following equation:

$$S_{W_{opt}}(t) = W_{opt}(t) \cdot S(t) = A_W(t) \cdot A \cdot (1+a(t)) \cdot e^{j(\phi_W(t) + \phi(t))}$$

Under these conditions, the corresponding power amplifier output signal, denoted $D_{W_{opt}}(t)$, satisfies the following equation:

$$D_{W_{opt}}(t) = B \cdot (1 + a_1 \cdot (A_W(t) \cdot (1+a(t)) - 1)) \cdot e^{j[\phi_W(t) + \phi(t) + k \cdot (A_W(t) \cdot (1+a(t)) - 1) + \phi_0 + \phi_R]}$$

where $W_{opt}(t)$ is the optimal predistortion coefficient.

In this context, given that by assumption the optimal predistortion coefficient compensates for the signal distortion introduced by the power amplifier, the power amplifier output signal $D_{W_{opt}}(t)$ must therefore then be equal to the original signal S(t).

The following equation is therefore satisfied:

$$A \cdot (1+a(t)) = B \cdot (1 + a_1 \cdot (A_W(t) \cdot (1+a(t)) - 1))$$

It is then possible to write:

$$A_W(t) = \frac{\left[ \frac{\left( \frac{A \cdot (1 + a(t))}{B} - 1 \right)}{a_1} + 1 \right]}{(1 + a(t))}$$

The following equation is deduced from this by applying a first-order expansion as a function of a(t):

$$A_W(t) = \left( \frac{A}{B \cdot a_1} + \frac{a_1 - 1}{a_1} \right) + a(t) \cdot \frac{(1 - a_1)}{a_1}$$

Likewise, the respective phases of the input signal and of the output signal from the power amplifier are equal and, hence, the following equation is therefore satisfied:

$$\varphi_W(t) = -[k \cdot (A_w(t) \cdot (1 + a(t)) - 1) + \varphi_0 + \varphi_R]$$
$$= -\left[ k \cdot \left( \frac{1-B}{B \cdot a_1} + \frac{a(t)}{B \cdot a_1} \right) + \varphi_0 + \varphi_R \right]$$

The optimal predistortion coefficient can therefore then be written in the following form:

$$W_{opt}(t) = \left[ \left( \frac{A}{B \cdot a_1} + \frac{a_1 - 1}{a_1} \right) + a(t) \cdot \frac{(1-a_1)}{a_1} \right] \cdot e^{-j\left[ k \cdot \left( \frac{1-B}{B \cdot a_1} + \frac{a(t)}{B \cdot a_1} \right) + \varphi_0 \right]}$$

By applying a first-order expansion as a function of a(t), we then obtain:

$$W_{opt}(t) = \left( \frac{A}{B \cdot a_1} + \frac{a_1 - 1}{a_1} \right) \cdot e^{-j\left[ k \cdot \left( \frac{1-B}{B \cdot a_1} \right) + \varphi_0 \right]} +$$
$$a(t) \cdot \left[ \frac{(1-a_1)}{a_1} - j \cdot \left( \frac{1}{B \cdot a_1} + \frac{a_1 - 1}{a_1} \right) \cdot \frac{k}{B \cdot a_1} \right] \cdot e^{-j\left[ k \cdot \left( \frac{1-B}{B \cdot a_1} \right) + \varphi_0 \right]}$$

$W_{opt}$ can therefore be expressed to first order in the form as stated above:

$$W(t) = C(t) + E(t) \cdot a(t)$$

C(t) and E(t) being complex.

It should be noted that the values of C(t) and of E(t) may be obtained by various procedures, in particular by implementing an iterative algorithm.

In an embodiment of the present invention, a stochastic gradient algorithm is implemented to determine the values of these predistortion parameters C(t) and E(t). Thus, it is possible to avoid the complexity related to a direct resolution, and it is then possible to adapt these parameters continuously as a function of the temporal evolution of the characteristics of the power amplifier.

In this embodiment, it is in particular possible to seek to reduce the following square error:

$$e^2 = \|e(t+1)\|^2 = \|S(t+1) - D_W(t+1)\|^2$$

In order to obtain the respective expressions for the predistortion parameters C(t) and E(t), it is possible to determine the values of the complex derivative of the output signal from the power amplifier with respect to the parameter C(t), this derivative being denoted $$\frac{\partial D_w^*(t+1)}{\partial C(t)},$$

and of the complex derivative of the output signal with respect to the parameter E(t), this derivative being denoted $$\frac{\partial D_w^*(t+1)}{\partial E(t)}.$$

The following equation can then be written:

$$\frac{\partial D_w^*(t+1)}{\partial C(t)} = \frac{\partial D_w^*(t+1)}{\partial S_w(t+1)} \cdot \frac{\partial S_w^*(t+1)}{\partial C(t)} = \frac{\partial D_w^*(t+1)}{\partial S_w(t+1)} \cdot S(t+1)^*$$

where $$\frac{\partial D_w^*(t+1)}{\partial S_W(t+1)}$$

is the complex derivative of the output signal from the power amplifier with respect to the signal $S_W(t)$ corresponding to the input signal S(t) to which the predistortion coefficient has been applied.

This complex derivative of the output signal from the power amplifier with respect to the signal $S_W(t)$ can be calculated or estimated in various ways.

In an embodiment of the present invention, provision is made to perform an approximation of this derivative by the ratio of the output signal to the input signal of the power amplifier. This approximation allows a simple embodiment and easy implementation of the iterative stochastic gradient algorithm.

In the context of such an approximation, the following equation may be written:

$$\frac{\partial D_W^*(t+1)}{\partial S_w(t+1)} \approx \frac{D_w^*(t+1)}{S_w^*(t+1)} \quad [1]$$

From this is then deduced:

$$\frac{\partial D_w^*(t+1)}{\partial C(t)} \approx \frac{D_w^*(t+1)}{S_w^*(t+1)} \cdot S(t+1)^* = \frac{D_w^*(t+1)}{W^*(t)}$$

From this is also deduced:

$$\frac{\partial D_w^*(t+1)}{\partial E(t)} = \frac{\partial D_w^*(t+1)}{\partial S_w(t+1)} \cdot \frac{\partial S_w^*(t+1)}{\partial E(t)} = \frac{\partial D_w^*(t+1)}{\partial S_w(t+1)} \cdot a(t+1) \cdot S(t+1)^*$$

By using, in the preferred embodiment, the approximation stated in equation [1] for the derivative, it is possible to write:

$$\frac{\partial D_w^*(t+1)}{\partial E(t)} \approx \frac{D_w^*(t+1)}{S_w^*(t+1)} \cdot a(t+1) \cdot S(t+1)^* = \frac{D_w^*(t+1)}{W^*(t)} \cdot a(t+1)$$

The expressions for the stochastic gradient applied to the predistortion parameters then become, in an embodiment of the present invention:

$$C(t+1) = C(t) + \mu_c \cdot e(t+1) \cdot \left(\frac{D_w(t+1)}{W(t)}\right)^*$$

$$E(t+1) = E(t) + \mu_e \cdot e(t+1) \cdot \left(\frac{D_w(t+1)}{W(t)}\right)^* \cdot a(t+1)$$

$$W(t+1) = C(t) + E(t) \cdot a(t+1)$$

where $e(t+1) = S(t+1) - D_W(t+1)$ where $\mu_c$ and $\mu_e$ are step sizes of the gradient respectively for the parameters $C(t)$ and $E(t)$.

In an embodiment, it is considered that the power amplifier and the other elements of the transmission chain induce a delay $\tau$ with respect to the original signal, this delay being assumed to be known. The reference signal, $S(t+1)$, is therefore delayed by this delay $\tau$.

More precisely, in the above scheme, the square error that one seeks to minimize, or reduce, satisfies the following equation:

$$e^2 = \|e(t+1)\|^2 = \|S(t+1-\tau) - D_W(t+1)\|^2$$

The expressions for the stochastic gradient therefore become, in an embodiment of the present invention:

$$C(t+1) = C(t) + \mu_c \cdot e(t+1) \cdot \left(\frac{D_w(t+1)}{W(t)}\right)^*$$

$$E(t+1) = E(t) + \mu_e \cdot e(t+1) \cdot \left(\frac{D_w(t+1)}{W(t)}\right)^* \cdot a(t+1)$$

$$W(t+1) = C(t) + E(t) \cdot a(t+1)$$

where $e(t+1) = S(t+1-\tau) - D_W(t+1)$

Additionally, the power of the output signal may be affected by the fact that this output signal is introduced into the return pathway by coupling, and it is difficult to precisely control the gain relating to this coupling. The power transmitted may therefore be affected thereby.

Provision may be made to circumvent this problem by normalizing the signal which is observed on the return pathway before performing the comparison between this signal and the reference signal, which is itself normalized.

In this case, to avoid an indeterminacy in the power actually transmitted, it is possible for example to force the value of the predistortion parameter $C(t)$ to the value 1, and thus the mean power value of the predistorted signal sent to the power amplifier is maintained at an almost unit power value. In this variant, the parameter $C(t)$ therefore remains at a value equal to 1, and, hence, only $E(t)$ is calculated, as detailed previously.

In an embodiment of the present invention, it is also possible to seek to circumvent an absolute phase error in the radio signal transmitted.

The absolute phase of the signal transmitted has no influence either on the characteristics of the signal transmitted, or on the performance of the demodulator of the receiver. Specifically, either the receiver is of the noncoherent type and, hence, is not influenced by the absolute phase of the signal, or the receiver is of the coherent type and, in this case, it commences the processing of the signal received with a channel estimation and hence an estimation of the phase of the signal, including the absolute phase of the signal transmitted, before demodulating this signal received.

Furthermore, estimation and correction of this absolute phase on transmission would add needless complexity to the transmission chain.

Consequently, to circumvent this absolute phase on transmission, it is possible to estimate the phase of the correlation between the signal coming from the return pathway and the reference signal and to correct the signal received on the return pathway by this estimated phase. The correlation between the signal of the return pathway and the reference signal may be performed for example over a sliding window or else, in particular in the case of the implementation of the variant described hereinbelow, it may be performed on each frame.

This embodiment is particularly effective in combination with the implementation of the embodiment in which the parameter $C(t)$ is maintained equal to 1 as described hereinabove.

In a variant, $C(t)$ and $E(t)$ may be updated continuously, or else $E(t)$ alone may be continuously updated in the case where $C(t)$ is maintained equal to 1, while only from time to time, for example every frame if the transmission is organized frame-wise, updating the predistortion coefficient $W(t)$ applied to the signal output by the modulator. Thus, provision may be made to update the predistortion coefficient $W(t)$ only every frame for example. The same predistortion coefficient is then applied over the duration of an entire frame.

Such a variant makes it possible to reduce the real-time implementation constraints of the procedure for linearizing the power amplifier according to an embodiment of the present invention. It should be noted that, in this case, the first frame, or the start of the signal transmitted, is not predistorted.

In an embodiment of the present invention, in order to reduce the delay in the application of the predistortion, it is possible to apply a precharacterization to the modulated signal to be transmitted before applying the predistortion as described previously. This precharacterization corresponds to an initialization or calibration phase in the course of which initial predistortion coefficients are determined.

It consists in compensating for the distortions of the power amplifier on the basis of measurements made previously on the equipment comprising a transmission chain according to an embodiment of the present invention, for example at the time of manufacture, or else at the time at which tests are performed on the equipment, or else on the basis of an average of measurements performed on equipment of one and the same type.

Such a precharacterization makes it possible to correct part of the distortions of the power amplifier, whereas the predistortion makes it possible to improve the correction of these distortions and to follow their evolution over time since these distortions vary as a function of diverse parameters such as temperature, supply voltage, standing wave ratio, the ageing of the power amplifier, etc.

The implementation of a precharacterization makes it possible to reduce the degradations of the spectrum at the start of transmission, it also makes it possible to accelerate the convergence of an iterative algorithm by giving a starting point that is closer to the optimal point of convergence of the algorithm.

Figure 2:
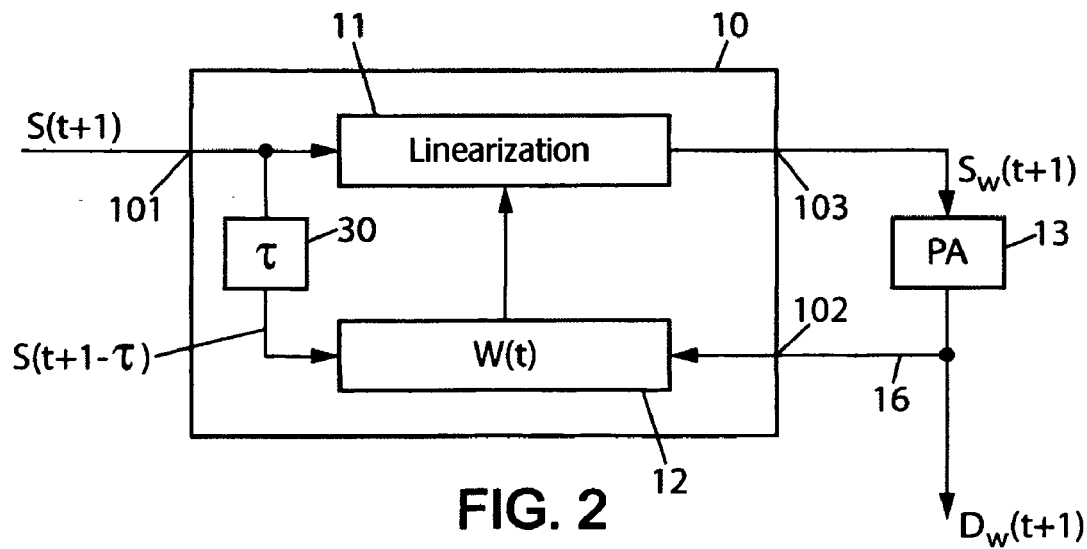
FIG. 2 illustrates a part of a radio signal transmission chain inducing a delay according to an embodiment of the present invention.

FIG. 2 illustrates a part of a radio signal transmission chain inducing a delay according to an embodiment of the present invention.

$S(t+1)$ is the input signal entering the predistortion module 10.

$S_W(t+1)$ is the output signal from the predistortion module 10, this signal arising from the application of the predistortion coefficient to the input signal $S(t+1)$.

It is assumed here that the power amplifier and the other elements of the transmission chain induce a delay 30 with respect to the original signal, this delay, $\tau$, being assumed to be known. The input signal, or reference signal, $S(t+1)$, is therefore delayed by this delay $\tau$.

The square error that one seeks to reduce, or minimize, satisfies the following equation, in the case where the power amplifier and the transmission chain do not induce any delay:

$$e^2 = \|e(t+1)\|^2 = \|S(T+1) - D_W(t+1)\|^2$$

The application of a stochastic gradient algorithm may then provide the following equations, in the case where the power amplifier and the transmission chain do not induce any delay:

$$C(t+1) = C(t) + \mu_c \cdot e(t+1) \cdot \left(\frac{D_w(t+1)}{W(t)}\right)^*$$

$$E(t+1) = E(t) + \mu_e \cdot e(t+1) \cdot \left(\frac{D_w(t+1)}{W(t)}\right)^* \cdot a(t+1)$$

and $$W(t+1) = C(t) + E(t) \cdot a(t+1)$$

where $e(t+1) = S(t+1) - D_W(t+1)$;
where $\mu_c$ and $\mu_e$ correspond to the step sizes of the gradient respectively for the parameters $C(t)$ and $E(t)$.

In the case where the power amplifier and the transmission chain create a delay $\tau$ in the signal transmitted, the square error that one seeks to reduce, or minimize, satisfies the following equation:

$$e^2 = \|e(t+1)\|^2 = \|S(t+1-\tau) - D_W(t+1)\|^2$$

The equations obtained by applying the stochastic gradient algorithm may then be written in the following form:

$$C(t+1) = C(t) + \mu_c \cdot e(t+1) \cdot \left(\frac{D_w(t+1)}{W(t)}\right)^*$$

$$E(t+1) = E(t) + \mu_e \cdot e(t+1) \cdot \left(\frac{D_w(t+1)}{W(t)}\right)^* \cdot a(t+1)$$

$$W(t+1) = C(t) + E(t) \cdot a(t+1)$$

where $$e(t+1) = S(t+1-\tau) - D_W(t+1)$$

Additionally, provision may advantageously be made to apply the principles of the present invention to modulated signals whose modulation component varies more significantly.

This case may in particular arise in the context of multi-carrier modulations for which the statistical distribution of the signal to be transmitted is almost Gaussian, or in the context of modulations with a strongly non-constant envelope, such as for example modulations of the QAM (Quadrature Amplitude Modulation) type, or of the π/4 DQPSK (π/4 Differential Quaternary Phase Shift Keying) type which are used for example in the TETRA (standing for "TErrestrial Trunked RAdio') professional radio communications system.

In this context, provision is made to implement an embodiment of the present invention, by dividing the signal that one wishes to transmit into various classes of signal, each class of signal corresponding to a span of variation that is limited around a mean value of the amplitude in said class.

Thus, the spans of variation corresponding to these various classes are defined while ensuring that, within each of these classes, the assumption of small variation about the mean value of the amplitude of this class is complied with. Next, the teaching described hereinabove in respect of a signal exhibiting small variations is applied to each of the classes defined in respect of a signal exhibiting more significant variations.

It is thus possible to obtain, for each of these classes, the parameters $C(t)$ and $E(t)$ as described hereinabove in respect of a signal exhibiting small variations.

Figure 3:
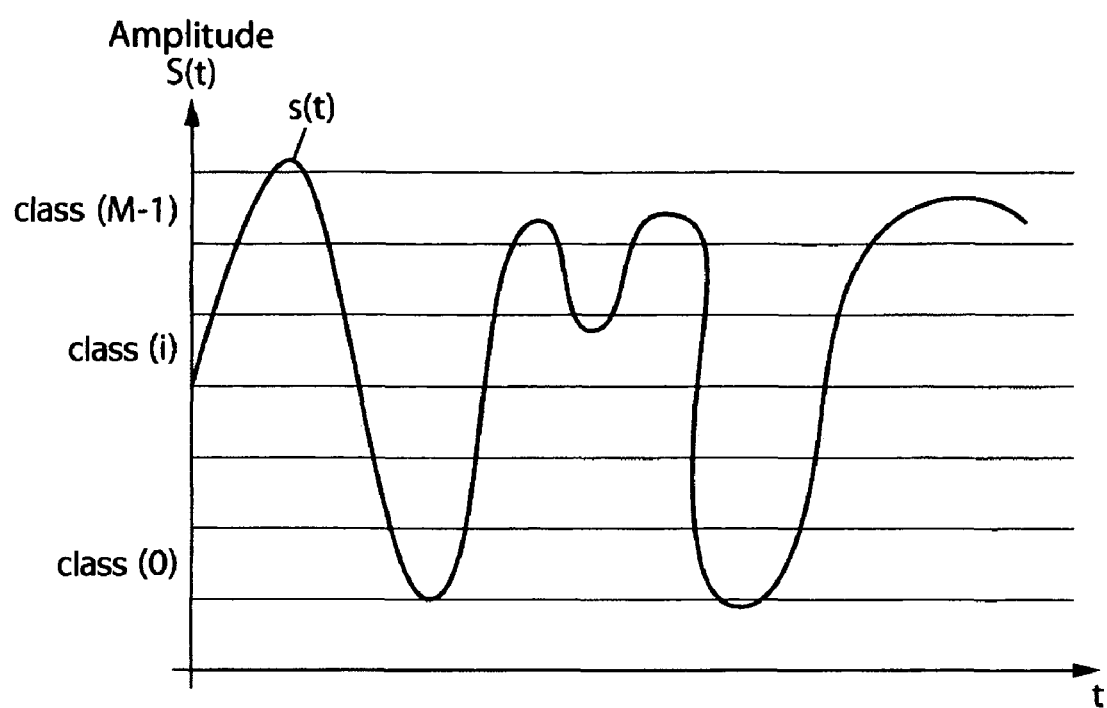
FIG. 3 illustrates an application of a signal processing according to an embodiment of the present invention in which the input signal exhibits relatively significant variations.

FIG. 3 illustrates the variations of the signal $S(t)$ as a function of time t, over which are defined classes 0 to M−1 per band of amplitudes, or else per class, thus making it possible to apply the teaching described hereinabove to a signal $S(t)$ exhibiting more significant amplitude variations.

In an embodiment of the present invention, provision may also be made to force the parameter $C(t)$ to the value 1. It is however preferable to force this predistortion parameter to this value 1 only for the class for which the mean power of the signals falling in said class is closest to the mean power of the signal that one wishes to transmit. Next, the parameters $C(t)$ of the other classes as well as the parameters $E(t)$ of the whole set of classes are then calculated according to one of the possible procedures as described previously, in particular according to a stochastic gradient algorithm.

The invention claimed is:

1. Method of processing a signal in a transmission chain comprising:
a power amplifier adapted for receiving as input a signal to be amplified $S_W(t)$ and adapted for providing as output an amplified signal $D_W(t)$;
a predistortion module comprising, on the one hand, a linearization unit adapted for applying a predistortion coefficient W(t) to an input signal S(t), and, on the other hand, a unit for determining said predistortion coefficient;
said processing method comprising the following steps implemented at the level of the predistortion module:
/a/ at the level of the unit for determining the predistortion coefficient, receiving, on the one hand, the input signal S(t) and, on the other hand, the amplified signal $D_W(t)$ through a return pathway, and determining the predistortion coefficient on the basis of a comparison between the input signal S(t) and the amplified signal $D_W(t)$;
/b/ at the level of the linearization unit, applying the predistortion coefficient W(t) to the input signal S(t), so as to provide as output the signal to be amplified $D_W(t)$;
in which the predistortion coefficient W(t) is determined, in step /a/, on the basis of a first-order approximation of the input signal.

2. Processing method according to claim 1, in which the input signal satisfies the following equation according to the first-order approximation:

$$S(t) = A \cdot (1 + a(t)) \cdot e^{j \cdot \phi(t)}$$

where A represents the mean amplitude of the signal, a(t) represents the relative variation of the amplitude of the signal, j represents the square root of −1; and $\phi(t)$ the phase of the signal; and in which the predistortion coefficient W(t) satisfies the following equation:

$$W(t) = C(t) + E(t) \cdot a(t)$$

where C(t) and E(t) correspond to first and second predistortion parameters which are complex functions of time.

3. Processing method according to claim 2, in which the predistortion parameter C(t) is fixed to the value 1.

4. Processing method according to claim 3, in which at least one out of the first and second predistortion parameters is determined by applying a stochastic gradient algorithm.

5. Processing method according to claim 2, in which at least one out of the first and second predistortion parameters is determined by applying a stochastic gradient algorithm.

6. Processing method according to claim 5, in which the predistortion parameter E(t) satisfies the following equation:

$$E(t+1) = E(t) + \mu_e \cdot e(t+1) \cdot \left(\frac{D_w(t+1)}{W(t)}\right)^* \cdot a(t+1)$$

where $D_W(t+1)$ corresponds to the signal amplified by the power amplifier and received at the level of the determining unit via the return pathway;
where $e(t+1) = S(t+1) - D_w(t+1)$;
where $\mu_e$ is the step size of the gradient for the predistortion parameter E(t); and
the predistortion coefficient satisfies the following equation:

$$W(t+1) = C(t) + E(t) \cdot a(t+1).$$

7. Processing method according to claim 6, in which the predistortion parameter C(t) also satisfies the following equation:

$$C(t+1) = C(t) + \mu_c \cdot e(t+1) \cdot \left(\frac{D_w(t+1)}{W(t)}\right)^*$$

where $D_W(t+1)$ corresponds to the signal amplified by the power amplifier and received at the level of the determining unit via the return pathway; and
where W(t) corresponds to the predistortion coefficient; and where $\mu_{c'}$ is the step size of the gradient algorithm for the predistortion parameter C(t).

8. Processing method according to claim 5, in which the input signal S(t) and the amplified signal $D_W(t)$ being shifted by a delay $\tau$, the predistortion parameter E(t) satisfies the following equation:

$$E(t+1) = E(t) + \mu_e \cdot e(t+1) \cdot \left(\frac{D_w(t+1)}{W(t)}\right)^* \cdot a(t+1)$$

where $D_W(t+1)$ corresponds to the signal amplified by the power amplifier and received at the level of the determining unit via the return pathway;
where $e(t+1) = S(t+1-\tau) - D_w(t+1)$;
where $\mu_e$ is the step size of the gradient for the predistortion parameter E(t); and
the predistortion coefficient satisfies the following equation:

$$W(t+1) = C(t) + E(t) \cdot a(t+1).$$

9. Processing method according to claim 8, in which moreover the predistortion parameter C(t) satisfies the following equation:

$$C(t+1) = C(t) + \mu_c \cdot e(t+1) \cdot \left(\frac{D_w(t+1)}{W(t)}\right)^*$$

where $D_W(t+1)$ corresponds to the signal amplified by the power amplifier and received at the level of the determining unit via the return pathway; and
where W(t) corresponds to the predistortion coefficient; and where $\mu_c$ is the step size of the gradient algorithm for the predistortion parameter C(t).

10. Processing method according to claim 1, in which the signal to be amplified is organized in the form of frames and the predistortion coefficient is updated at each N frame(s), N being an integer greater than or equal to 1.

11. Processing method according to claim 1, in which, before step /a/, an initialization phase in the course of which at least one initial predistortion coefficient is determined.

12. Processing method according to claim 1, in which the input signal S(t) is decomposed into a plurality of portions of input signal, each portion of input signal belonging to various amplitude spans, and in which a plurality of predistortion coefficients $W_i(t)$ is obtained, for i going from 1 to N, N being an integer strictly greater than 1, respectively for the plurality of portions of input signal, by applying steps /a/ and /b/ to each of said portions of input signal, on the basis of a first-order approximation of said portion of input signal.

13. Signal transmission chain comprising:
a power amplifier adapted for receiving as input a signal to be amplified and for providing as output an amplified signal;

a predistortion module comprising, on the one hand, a linearization unit adapted for applying a predistortion coefficient to an input signal, and, on the other hand, a unit for determining said predistortion coefficient;

in which the unit for determining the predistortion coefficient is adapted for receiving, on the one hand, the input signal and, on the other hand, the amplified signal through a return pathway, and for determining the predistortion coefficient on the basis of a comparison between the input signal and the amplified signal on the basis of a first-order approximation of the input signal; and, in which the linearization unit is adapted for receiving the input signal, and applying the predistortion coefficient so as to provide as output the signal to be amplified.

14. Signal transmission chain according to claim 13, wherein the input signal satisfies the following equation according to the first-order approximation:

$$S(t)=A\cdot(1+a(t))\cdot e^{j\cdot\phi(t)}$$

where A represents the mean amplitude of the signal, a(t) represents the relative variation of the amplitude of the signal, j represents the square root of −1; and φ(t) the phase of the signal; and in which the predistortion coefficient W(t) satisfies the following equation:

$$W(t)=C(t)+E(t)\cdot a(t)$$

where C(t) and E(t) correspond to first and second predistortion parameters which are complex functions of time.

15. The signal transmission chain of claim 14 wherein the predistortion parameter C(t) is fixed to the value 1.

16. The signal transmission chain of claim 14 wherein at least one out of the first and second predistortion parameters is determined by applying a stochastic gradient algorithm.

17. The signal transmission chain of claim 16 wherein which the predistortion parameter E(t) satisfies the following equation:

$$E(t+1) = E(t) + \mu_e \cdot e(t+1) \cdot \left(\frac{D_w(t+1)}{W(t)}\right)^* \cdot a(t+1)$$

where $D_W(t+1)$ corresponds to the signal amplified by the power amplifier and received at the level of the determining unit via the return pathway;

where e(t+1)=S(t+1)−$D_w$(t+1);

where $\mu_e$ is the step size of the gradient for the predistortion parameter E(t); and the predistortion coefficient satisfies the following equation:

$$W(t+1)=C(t)+E(t)\cdot a(t+1).$$

18. The signal transmission chain of claim 17, wherein the predistortion parameter C(t) also satisfies the following equation:

$$C(t+1) = C(t) + \mu_c \cdot e(t+1) \cdot \left(\frac{D_w(t+1)}{W(t)}\right)^*$$

where $D_W(t+1)$ corresponds to the signal amplified by the power amplifier and received at the level of the determining unit via the return pathway; and where W(t) corresponds to the predistortion coefficient;

and where $\mu_c$ is the step size of the gradient algorithm for the predistortion parameter C(t).

19. The signal transmission chain of claim 16, wherein the input signal S(t) and the amplified signal $D_W(t)$ being shifted by a delay τ, the predistortion parameter E(t) satisfies the following equation:

$$E(t+1) = E(t) + \mu_e \cdot e(t+1) \cdot \left(\frac{D_w(t+1)}{W(t)}\right)^* \cdot a(t+1)$$

where $D_W(t+1)$ corresponds to the signal amplified by the power amplifier and received at the level of the determining unit via the return pathway;

where e(t+1)=S(t+1−τ)−$D_w$(t+1);

where $\mu_e$ is the step size of the gradient for the predistortion parameter E(t); and the predistortion coefficient satisfies the following equation:

$$W(t+1)=C(t)+E(t)\cdot a(t+1).$$

20. The signal transmission chain of claim 13, wherein the signal to be amplified is organized in the form of frames and the predistortion coefficient is updated at each N frame(s), N being an integer greater than or equal to 1.

21. The signal transmission chain of claim 13, wherein the linearization unit is initialized prior to the determination of at least one initial predistortion coefficient.

22. The signal transmission chain of claim 13, wherein the input signal S(t) is decomposed into a plurality of portions of input signal, each portion of input signal belonging to various amplitude spans, and in which a plurality of predistortion coefficients $W_i(t)$ is obtained, for i going from 1 to N, N being an integer strictly greater than 1, respectively for the plurality of portions of input signal, where the unit for determining the predistortion coefficient and the linearizatrion unit are applied to each portion of the input signal on the basis of a first-order approximation of said portion of input signal.

* * * * *